United States Patent [19]

Bourassa et al.

[11] Patent Number: 4,679,170
[45] Date of Patent: * Jul. 7, 1987

[54] RESISTOR WITH LOW THERMAL ACTIVATION ENERGY

[75] Inventors: Ronald R. Bourassa; Douglas B. Butler, both of Colorado Springs, Colo.

[73] Assignee: Inmos Corporation, Colorado Springs, Colo.

[*] Notice: The portion of the term of this patent subsequent to Apr. 14, 2004 has been disclaimed.

[21] Appl. No.: 797,050

[22] Filed: Nov. 12, 1985

Related U.S. Application Data

[62] Division of Ser. No. 615,166, May 30, 1984, Pat. No. 4,560,419.

[51] Int. Cl.$^4$ .................... H01L 27/04; G11C 11/40
[52] U.S. Cl. ................................ 365/154; 357/51; 357/59
[58] Field of Search ................ 357/51, 41, 59; 365/154

[56] References Cited

U.S. PATENT DOCUMENTS

| | | | |
|---|---|---|---|
| 3,248,677 | 4/1966 | Hunter et al. | 357/51 |
| 3,683,306 | 8/1972 | Bulthuis et al. | 357/51 |
| 3,943,545 | 3/1976 | Kim | 357/24 |
| 4,041,522 | 8/1977 | Oguey et al. | 357/42 |
| 4,214,918 | 7/1980 | Gat et al. | 148/1.5 |
| 4,297,721 | 10/1981 | McKenney et al. | 357/51 |
| 4,309,224 | 1/1982 | Shibata | 148/1.5 |
| 4,331,485 | 5/1982 | Gat | 148/1.5 |
| 4,377,819 | 3/1983 | Sakai et al. | 357/59 |
| 4,394,191 | 7/1983 | Wada et al. | 148/33.1 |
| 4,409,724 | 10/1983 | Tasch et al. | 29/571 |
| 4,462,150 | 7/1984 | Nishimura et al. | 29/576 B |
| 4,467,518 | 8/1984 | Bansal et al. | 29/576 B |
| 4,467,519 | 8/1984 | Glang et al. | 29/576 B |

FOREIGN PATENT DOCUMENTS

| | | | |
|---|---|---|---|
| 0087354 | 7/1981 | Japan | 29/576 B |
| 59-167047 | 9/1984 | Japan | 357/59 |

OTHER PUBLICATIONS

J. Manolin et al., "P-N Junctions in Polycrystalline Silicon Films", *Solid-State Electronics*, 1972, vol. 15, pp. 1103-1106.

Fair et al., "Modeling Rapid Thermal Annealing Processes for Shallow Junction Formation in Silicon", *IEDM* 1983, pp. 658-661.

Mahan et al., *IEEE-Trans. Electron. Devices*, ED-30 (Jan., 1983) 45.

Lloyd et al., *IBM-TDB*, 23, (1980) 2811.

Kugimiya, *Jap. J. Applied Phys.*, 21 (1982) L-16, L-19.

Borisenko et al, *Phys. Stat.-Solidi*, 75a (1983) 117.

Nishiyama et al, *Jap. J. Appl. Phys.*, 19 (1980) L-563.

Powell et al, *J. Vac. Sci, Technol.*, 20 (1982) 33.

Takebayashi et al., *J. Electrochem. Soc.*, 130 Nov. 1983) 2271.

Tsuchimoto et al., "Ion Implantation of Impurities Into Polycrystalline Silicon", *Ion Implantation in Semiconductors*, pp. 605-612 (Plenum Publ. 1975).

Choi et al., "Fabrication of Polysilicon Resistors Compensated with Double Ion—Implantation", Electrochemical Society, Abstract No. 516, pp. 754-755 (1984).

Lu et al., "Modeling and Optimization of Monolithic Polycrystalline Silicon Resistors", *IEEE Trans Electron Dev.*, ED-28, pp. 818-830 (Jul. 1981).

(List continued on next page.)

Primary Examiner—William D. Larkins
Attorney, Agent, or Firm—Edward D. Manzo

[57] ABSTRACT

An improved process in making a polysilicon resistor suitable for use as a load resistor in a static memory wherein after the doping of the polysilicon, the device is annealed by exposing it to a rapid increase of ambient temperature (up to between 900 and 1200° C.), maintaining the high ambient temperature for a controlled time (about 5 seconds) and then lowering the ambient temperature at a rapid rate. This decreases resistances by one order of magnitude and significantly decreases the temperature activation energy of the resistor. This permits static memory cells to retain data even though the cell has high leakage currents, thereby improving final test yields.

15 Claims, 12 Drawing Figures

OTHER PUBLICATIONS

Lu et al., "A New Conduction Model for Polycrystalline Silicon Films", *IEEE Electron Dev. Letters*, EDL-2, pp. 95–98 (1981).

Lu et al., "A Quantitiative Model of the Effect of Grain Size on the Resistivity of Polycrystalline Silicon Resistors", *IEEE Electron Dev. Letters*, EDL-1, pp. 38–41 (1980).

Taubenest et al., "Polycrystalline Silicon Integrated Thin Film Resistors", *Technical Report* 137, Centre Electronique Horloger S.A. (1973).

Seto, "Electrical Properties of Polycrystalline Silicon Films", *J. App. Phys.*, vol. 46, pp. 5247–5254 (1975).

deGraff et al., "Grain Boundary States and the Characteristics of Lateral Polysilicon Diodes", *Solid State Electronics*, pp. 67–71 (1982).

Dutoit et al., "Lateral Polysilicon p–n Diodes", *J-Electrochem. Soc. Solid-State Science and Tech.*, pp. 1648–1651 (1978).

Korsh et al., "Conduction Properties of Lightly Doped Polycrystalline Silicon", *Solid State Electronics*, pp. 1045–1051 (1978).

Dutoit, "Influence of Impurities on Lateral Polysilicon pn Diodes", *J. Electrochem Soc.*, vol. 130, pp. 967–968 (1983).

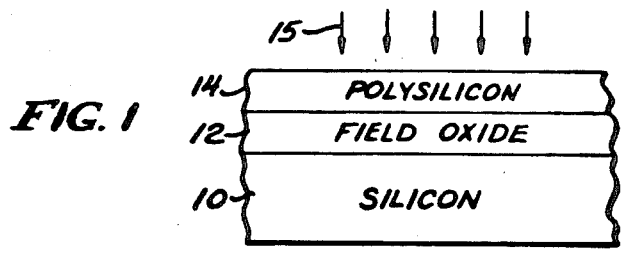
FIG. 1
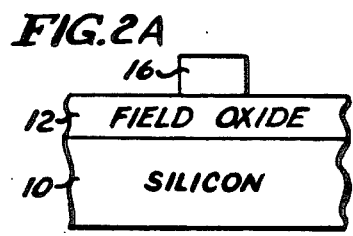
FIG. 2A
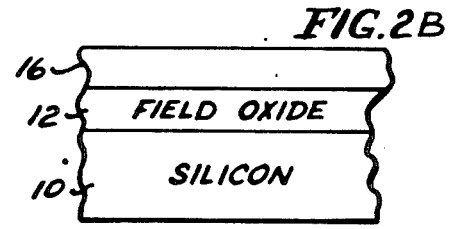
FIG. 2B
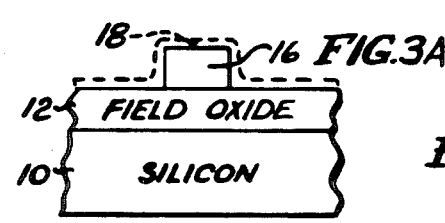
FIG. 3A
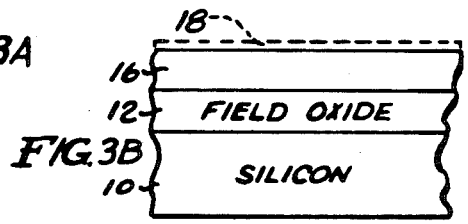
FIG. 3B
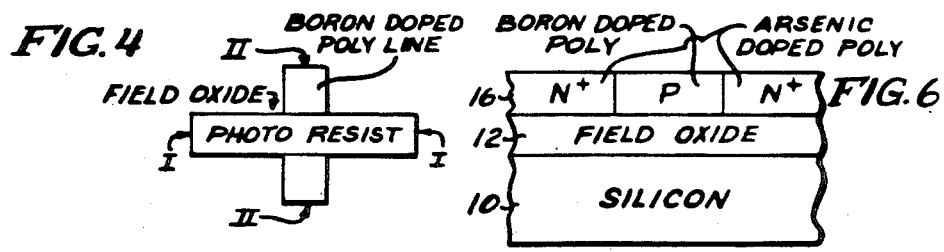
FIG. 4
FIG. 6
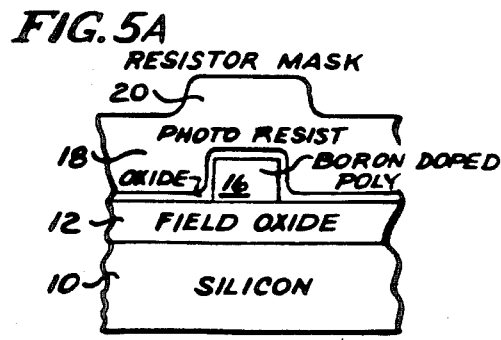
FIG. 5A
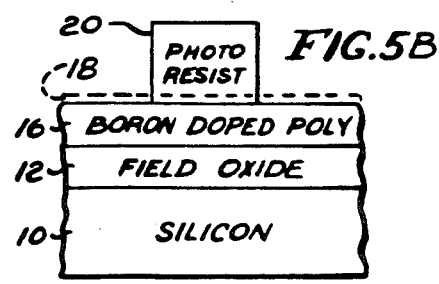
FIG. 5B

RESISTOR WITH LOW THERMAL ACTIVATION ENERGY

This case is a division of patent application No. 615,166, filed May 30, 1984, now U.S. Pat. No. 4,560,419.

BACKGROUND OF THE INVENTION

The present invention relates to semiconductor resistors of the type typically used in random access memories. More particularly, the present invention is concerned with a method for the fabrication of polysilicon resistors with low thermal "activation" energy. Resistors of this type are disclosed in applicant's pending application Ser. No. 449,984, filed Dec. 15, 1982, entitled "Polysilicon Resistor with Low Thermal Activation Energy," whose disclosure is hereby incorporated by reference thereto.

The prior Bourassa patent application disclosed a polysilicon resistor illustratively having the form of a polysilicon structure separated from the substrate by an insulator or dielectric. The poly structure has a central portion doped with P type impurity having beside it regions doped with N type impurity, the dopings being such that the thermal activation energy is below about 0.5 electron volts. It was further disclosed that the middle region could be doped with both P type and N type impurities. Of course, the resistor could be formed with P type regions on the outside and an N type region on the inside. It was found that the low thermal activation energy permitted the construction of a polysilicon device within the desired resistance range at normal operating temperatures, but the resistor would be able to mask appreciable leakage current even at low temperatures, without the disadvantage of drawing excessive current at high temperatures. The typical resistance for load resistors in static RAMS is approximately 0.1 to 50 gigaohms.

The present invention is concerned with a method for fabricating resistances suitable for use as load devices in static RAMS, for example. The prior Bourassa application disclosed methods of fabricating such devices, but did not disclose the present invention herein. Briefly, the prior Bourassa patent application set forth at least three methods for making the resistors there disclosed. The first method was to obtain a field oxide on top of a silicon substrate, depositing polysilicon over the insulating layer, doping the polysilicon uniformly with N type dopant at a concentration of up to about $10^{20}$ per cubic centimeter, then doping the polysilicon uniformly with P type dopant of equal or greater concentration but not less than $10^{18}$ per cubic centimeter. The next step described was to mask the resistor area and then dope the unmasked portion of the polysilicon with N type dopant at a concentration greater than the P type dopant.

The second method disclosed in the prior patent application also obtains a polysilicon layer separated from a monocrystalline silicon substrate layer by an insulating layer. Next, the resistor area is masked and the remaining polysilicon is doped with N type dopant at a concentration up to about $10^{21}$ per cubic centimeter. Next, the entire poly area is masked except for the resistor area which is then doped with N type impurity at a concentration of up to about $10^{20}$ per cubic centimeter. Next, with the mask still in place, the resistor area is doped with P type impurity at a concentration of between about $10^{18}$ and $10^{20}$ per cubic centimeter (but greater than or equal to the concentration of N type dopant which the resistor area was doped).

The third method disclosed in the prior Bourassa patent application is to obtain a polysilicon layer upon an insulating layer upon a silicon substrate. Next the polysilicon is doped uniformly with N type impurities at a concentration of up to about $10^{20}$ per cubic centimeter. After etching the poly lines, the entire circuit except for the resistor area is masked so that the resistor area can be doped with P type impurities at a concentration exceeding the concentration of the N type impurities.

Those methods resulted in the formation of a polysilicon resistor having a thermal activation energy in the range of about 0.1 to about 0.35 electron volts, which is considerably more effective than the activation energy of 0.5 to about 0.6 electron volts for normal polysilicon resistors. The advantage of such a structure is that such improved polysilicon resistors can tolerate more leakage at cold temperatures without reducing the voltage at the memory cell node so much that the memory cell would change state, while still staying within maximum current limits at high temperatures. Additionally, the sensitivity of the resistor to dopant concentration is drastically reduced, viz. from 5.3 decades per decade (resistance versus dopant concentration) down to 0.2 decades per decade. Other advantages are described in the prior Bourassa patent application.

The present invention relates to a further processing step involved in the fabrication of polysilicon resistors. Herein, the expression "diode" or "diodes" is occasionally used to mean a polysilicon resistance. This is because the resulting structure, considering the doping and configurations thereof, electrically resembles back-to-back diodes.

SUMMARY OF THE INVENTION

According to various aspects of the present invention, a poly resistor is formed preferably having a middle portion doped with one type of impurity and lateral contiguous portions doped with another type of impurity, thus forming an NPN or PNP type of structure, illustratively. Next, a heat treatment is provided in the fabrication of the polysilicon resistor. In its preferred form, there is a rapid anneal wherein the temperature of the entire wafer bearing the polysilicon resistors is raised quickly to, in the preferred embodiment, 1100° C. for 5 seconds and cooled rapidly. This is done before metal is added to the devices. As a result of this heat treatment, it is found that the resistance characteristics are improved. The resistance has been found to drop approximately one order of magnitude. The resistance can be adjusted or controlled by adjusting the temperature of the heat treatment or the time of it, or by controlling the cooling speed.

Devices which have been processed according to the preferred embodiment of the present invention undergo a physical change to some extent. Defects become mobile during the heat treatment and tend to move. This heat treatment passivates grain boundaries. The polysilicon recrystallizes and is much closer to the single crystalline form or state.

The heat treatment step also is found to lower the thermal activation energy. Without the rapid anneal of the preferred embodiment, the thermal activation energy has been about 0.21 electron volts. By using the rapid anneal of the preferred embodiment, however, the thermal activation energy is reduced to about 0.13 electron volts. As explained in the prior Bourassa patent application, this is an improvement in terms of the overall capabilities of the resistor because the resistor is used to mask leakage caused by defects. Indeed, the leakage itself can be thought of as having a temperature activation energy which is at least about 0.2 electron volts. If the thermal activation energy of a polysilicon resistor can be made lower than the activation energy for the defect or the leakage, then at lower temperatures, the polysilicon resistor can mask more current than is masked at room temperature. This becomes important because cold temperature testing is both difficult and expensive: condensation can freeze on probe tips at the low temperatures causing rejection of good units.

As a result, by using this invention, cold temperature testing can be eliminated because the resulting polysilicon resistors function quite well over the low temperature. If a manufacturer normally runs two high temperature tests and one cold temperature test, then by virtue of using the present invention, satisfactory testing may be obtained with just two tests. This increases the test capacity of the manufacturer by thirty-three percent.

At cold temperatures, generally the only failures of significance in a memory are data retention failures. These are due to junction leakage. By virtue of the present invention, the polysilicon resistors would allow devices to operate successfully with junction leakage levels up to ten times higher than previous resistors. Consequently, the present invention results in a great enhancement of final test yield, which is certainly a vital concern to every manufacturer.

BRIEF DESCRIPTION OF THE DRAWINGS

In describing the preferred embodiment, reference will be made to accompanying drawings of which:

FIG. 1 is a cross-sectional view of semiconductor elements used in making a polysilicon resistor;

FIG. 2A is a cross-sectional view showing a poly line where the resistor is to be made, and FIG. 2B is a side view of FIG. 2A structure;

FIGS. 3A and 3B are cross-sectional and side views, showing the oxide formed in a subsequent treatment step;

FIG. 4 is a top view showing the orientation of a photoresist on the poly line;

FIG. 5A is a sectional view along line I—I of FIG. 4, and FIG. 5B is a sectional view along lines II—II of FIG. 4;

FIG. 6 shows the resulting structure;

DETAILED DESCRIPTION OF A PREFERRED EMBODIMENT

Figure 7:
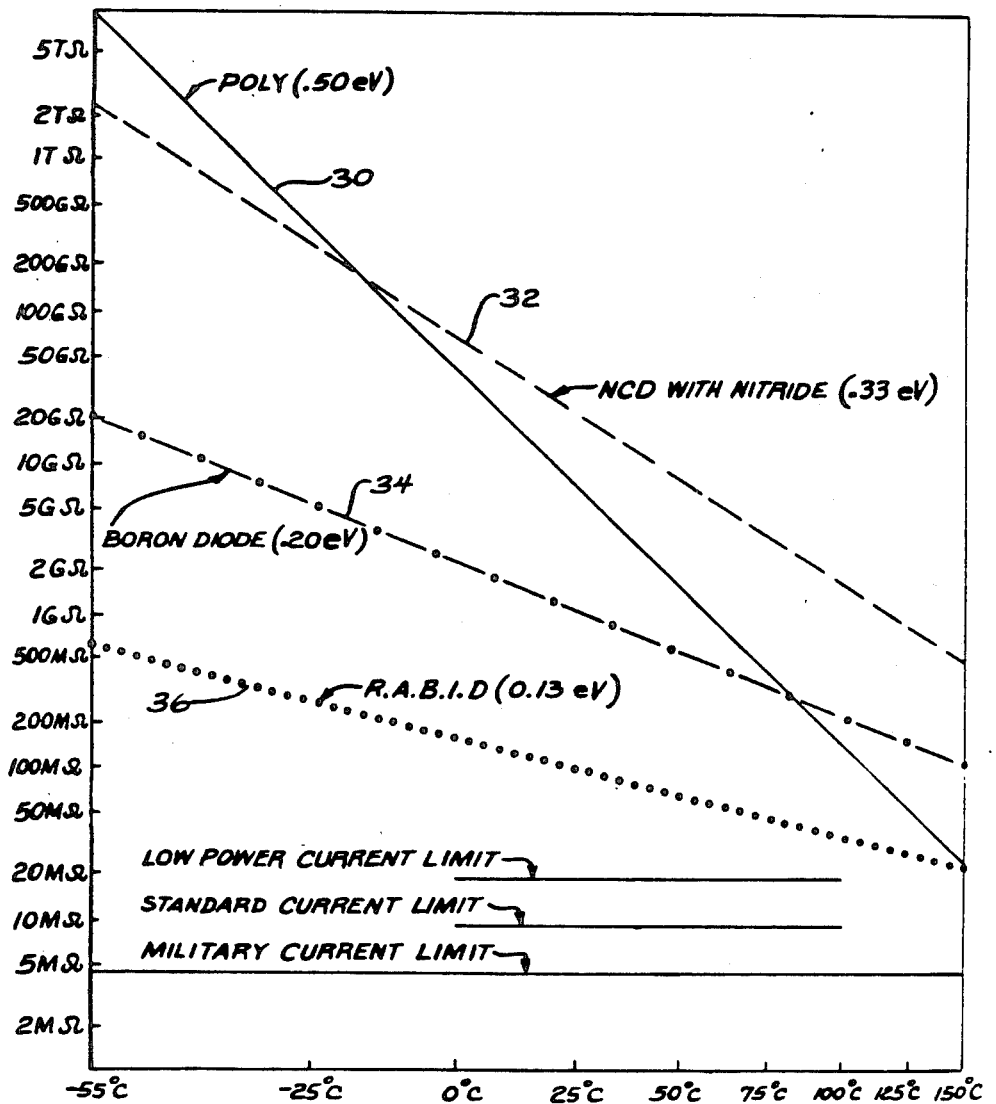
FIG. 7 is a graph comparing a resistor resulting from the present invention to prior devices.

A semiconductor device fabricated according to the preferred embodiment of the present invention can be called "RABID" which is an acronym meaning Rapid Annealed Boron Implanted Diode.

FIG. 1 represents a cross-sectional view of semiconductor elements. A substrate 10 of silicon is covered with about 6000 angstroms of field oxide or gate oxide 12. A layer 14 of polysilicon which is about 4500 angstroms thick is on top of layer 12. The entire layer 14 of polysilicon is then implanted with boron represented by arrows 15 illustratively at 27 keV to result in a doping of about $1 \times 10^{15}$ per square centimeter. It will be appreciated that this is a relatively light doping. This causes the polysilicon to become P type.

Next, the polysilicon is defined by traditional techniques, such as using a mask to result in a polysilicon line 16 on top of the oxide 12. FIG. 2A is a cross-sectional view of these elements. FIG. 2B is a side view of the structure shown in FIG. 2A.

The next step is to heat the polysilicon in a steam atmosphere. This causes the implanted boron to be distributed throughout the polysilicon line 16. Additionally, it results in a layer of thermal oxide 18 having a thickness of about 400 to 500 angstroms as shown in FIG. 3A in cross-section and FIG. 3B in a side view.

Next, a photoresist is placed across the top of the poly line 16. A top view showing the relative orientation of the photoresist 20 in this illustrative embodiment is shown in FIG. 4. FIG. 5A is a cross-sectional view taken along a line I—I of FIG. 4, and FIG. 5B is a side sectional view taken along a lines II—II of FIG. 4. Mask 20 is called a source-drain implant mask by those skilled in the art. This mask has a thickness of approximately 10,000 angstroms over the top of the poly line 16. After the photoresist is formed, according to the preferred embodiment, there is a heavy implanting of arsenic at the ends of the section of the poly line 16 which is to be the resistor. This arsenic doping of portions which are not masked makes the polysilicon N type where it is doped with arsenic. The region of poly line 16 which is masked by photoresist 20 will remain as P type, but it will be sandwiched between two N type regions. This makes an arrangement somewhat like NPN back-to-back boron silicon diodes. This arsenic implant step can optionally be combined with the source-drain implant at about 180 keV with a doping of about $5 \times 10^{15}$ per square centimeter.

Next the mask 20 photoresist is removed to result in the structure illustrated in FIG. 6, a side sectional view corresponding to FIG. 5B, which illustrates the arsenic doped polysiliconregions 22, 24 and the boron doped central region 26, all within poly line 16. The resulting N+ P N+ structure has the electrical characteristics of back-to-back boron diodes in polysilicon. The reverse bias resistivity is a function of heat treatments, doping concentrations, ambient conditions during the heat cycles and the voltage. For normal processing and a 1000° C. reflow, the resistor value will be about $1 \times 10^9$ ohms at 5 volts for a cross-sectional area of about one square micron.

Before and after the formation of this structure, other steps are accomplished to make the transistors and other structures needed in the memory or other type of integrated circuit.

However, before adding metal (aluminum) to the devices, a rapid anneal step is accomplished according to the preferred embodiment of the present invention. This can be achieved by the use of a heating device using halogen heat lamps. For example, the HEATPULSE 2101 Automatic Single-Wafer Heating System made by AG Associates of Palo Alto, Calif. 94303 is suitable. A different heating device, such as a Varian graphite heater, can be used. The type of heating device can be varied within the scope of the present invention. When using heat lamps in the HEATPULSE 2101, after placing the wafer containing the devices to be heated in the chamber, the heat lamp is turned on. The wafer heats up rapidly, e.g. in less than 20 seconds. The atmosphere is argon, nitrogen or air. The wafer is kept in this environment for two or more seconds, but preferably about 5 seconds. (However, if it is kept too long in these ambient conditions, the junctions would move too far causing deleterious effects on device characteristics.) Next, the power to the lamps is decreased as rapidly as possible to freeze in the high temperature defect distribution.

It is believed that the polysilicon recrystallizes as a result of this annealing step. The recrystallization would reduce the potential barriers due to grain boundaries. Also, it would activate more of the dopant material. The combined result of the decreased grain boundary potential and the increased free carrier concentration results in an increase in the reverse bias current of the polysilicon diode for a given voltage. Consequently, the effective resistance of the diode is reduced by about one order of magnitude. Other resistances in the circuit are also reduced. In particular, the resistivity doped poly is reduced about 21%, and the resistance of a buried contact is reduced by about 32%. Both of these effects increase the speed of the memory device. Even the resistivity of the doped single crystal silicon is reduced by 15%.

It has been found that the maximum sustained temperature should not exceed 1200° C., and best results were achieved at an anneal temperature of 1100° C. The anneal time can range from 2 seconds to 20 seconds without causing a drop in probe yield. The shorter the anneal time the larger the drop in the value of the cell resistor (RCELL). Other resistances such as the poly resistivity (RPOLY) and the buried contact resistance (RBC) do not show this effect. The maximum decrease is reached in less than two second and does not change with anneal time. The following Table 1 shows the results of testing (in terms of average numbers with standard deviations) where there was variation in the anneal time.

TABLE 1

| Anneal Time at 1100° C. (sec) | | Die Per Wafer | RCELL (GΩ) | RPOLY (Ω/□) | RBC (KΩ) |
| --- | --- | --- | --- | --- | --- |
| 2 | AVERAGE | 182.0 | 0.134 | 18.25 | 43.96 |
|   | STAN DEV | 26.5 | 0.006 | 0.31 | 2.65 |
| 5 | AVERAGE | 176.8 | 0.150 | 18.06 | 45.98 |
|   | STAN DEV | 37.2 | 0.005 | 0.45 | 2.57 |
| 10 | AVERAGE | 172.5 | 0.182 | 18.17 | 44.98 |
|   | STAN DEV | 36.1 | 0.003 | 0.25 | 3.08 |
| 20 | AVERAGE | 184.0 | 0.222 | 18.45 | 43.74 |
|   | STAN DEV | 26.2 | 0.009 | 0.45 | 0.85 |

The anneal time can be chosen to give the resistance desired. Best overall results were obtained for a 2 second anneal time at a temperature of 1100° C. with maximum cooling rate.

In terms of junction leakage failures, polysilicon resistors made according to the preferred embodiment of the present invention compare favorably to the boron doped polysilicon resistors described in the prior Bourassa patent application. When the boron resistors were used in a static memory, particularly the Inmos IMS 1400 device, junction leakage was tested by applying negative 10 volts to the substrate and checking for data retention. The boron resistors showed junction leakage failures of 38%, 24.4%, 14.7%, and 15% (average 21.2%); whereas the memory using RABID resistors exhibited junction leakage failures of 1.85%, 0%, 0.68%, and 2.09% (for an average of 1.13%). It is clear, therefore, that RABID resistors have fewer junction leakage failures.

FIG. 7 illustrates the resistance versus temperature curves for various resistor types which can be used in a static memory. A standard polysilicon resistor has an activation energy of about 0.5 electron volts and has the widest variation over the temperature range of −55° C. to 100° C. It is represented by curve 30 in FIG. 7. A so-called "nearly compensated diode" (NCD) is illustrated by curve 32. This device is described in the prior Bourassa patent application and consists of a polysilicon resistor having both P type and N type impurities in the central region with P type or N type impurities in the lateral two regions. That type of device has a thermal activation energy of about 0.33 electron volts. The so-called "boron diode" also described in the prior Bourassa application is represented by curve 34, and it has a thermal activation energy of about 0.20 electron volts. The resistor represented by curve 34 does not have a wide variation in resistance over the total temperature range. Curve 36 represents the device of curve 34 but with processing according to the present invention. This RABID resistor has a thermal activation energy of 0.13 electron volts. Also, it can be seen that the resistance is lower over the entire temperature range depicted in FIG. 7. Curve 36 is close to ideal in that it will mask 10 nanoamps of leakage even at −55° C. Yet, it will not cause the memory to exceed the low power current limit at 150° C.

Figure 8:
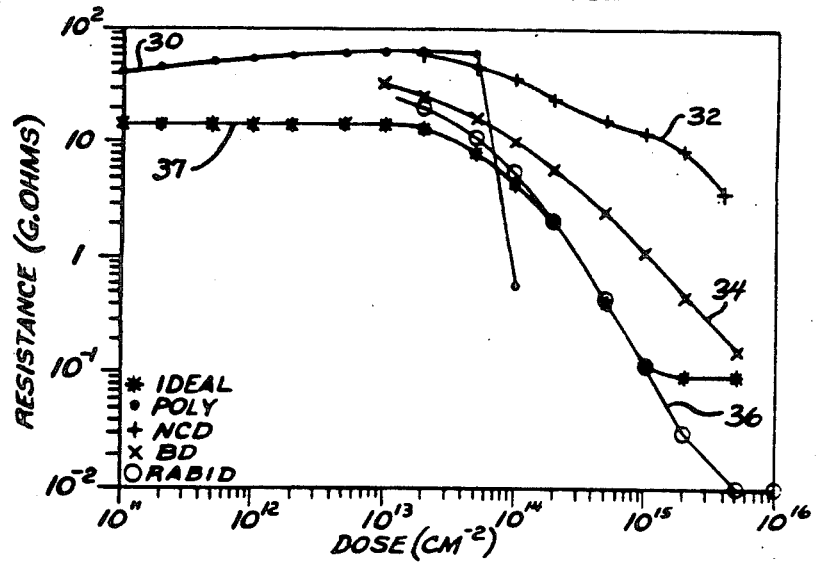
FIG. 8 is a graph showing resistance plotted against implant dosage for the present invention compared to prior resistor types.

FIG. 8 uses the same reference numerals as FIG. 7 and graphically shows the variation of resistance (in gigaohms) with dosage (per square centimeter). To generate FIG. 8, wafers carrying Inmos IMS 1400 or 1420 memories in fabrication received a 5 second, 1100° C. rapid anneal followed by cooling. An ideal curve 37 is made from computed resistor values which will just meet the low power limit at high temperature and have temperature activation energies attainable for a given dose. It can be seen that RABID resistors (curve 36) follow the ideal curve 37 in the boron dose range from $10^{14}$ to $10^{15}$ per square centimeter.

Figure 9:
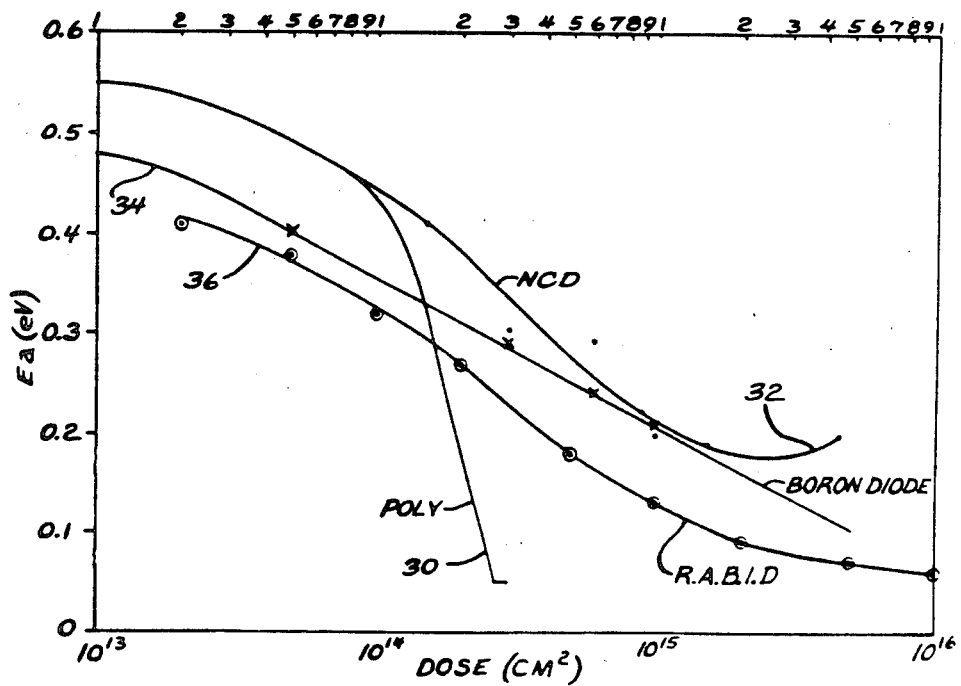
FIG. 9 is a graph plotting thermal activation energy against dosage for several types of resistors.

FIG. 9 also follows the reference numerals of FIG. 7 and illustrates the activation energies for various resistor types. It will be seen that the RABID device (curve 36) has lower thermal activation energy for a given dose than either NCD or boron diode type resistors.

In conclusion, the rapid heat annealing step in the fabrication of polysilicon resistors according to the present invention results in a resistor which at 0° C. will mask up to 30 nano-amperes of current, compared to only two nanoamperes for a standard boron doped polysilcon resistor, and merely 0.1 nanoamps for a standard polysilicon resistor. At the military cold temperature test of −55° C., the RABID resistor of the present invention will mask 8 nanoamperes compared to 0.3 nanoamperes for a boron doped polysilicon resistor without the rapid annealing process, and compared to 0.5 picoamperes for a standard polysilicon resistor. Thus, the present invention leads to dramatically improved performance.

In Ser. No. 449,984 there is disclosed a polysilicon structure with middle and contiguous lateral regions. The middle region may have one type of impurity with the lateral regions having the other type of impurity. Moreover, it is further disclosed that the middle region may be "nearly compensated" by being doped with both p type and n type impurities. The rapid annealing can be used on a poly structure which has a middle region with both types of impurity.

It will be appreciated that the present invention is not limited to the specific description stated herein. Persons skilled in the art after comprehending the present disclosure and invention will find other embodiments within the true spirit and scope of the present invention.

What is claimed as the invention is:

1. A method of using a polysilicon structure as a resistance device in a semiconductor circuit comprising the steps of:

coupling a polysilicon structure in circuit with portions of an integrated circuit, applying a voltage across said polysilicon structure, and obtaining a current through said polysilicon structure proportional to said voltage, said polysilicon structure comprising a polysilicon region, a selected one of N-type and P-type impurities defining a middle area in said polysilicon region, the other one of said N-type and P-type impurities defining other areas located in said polysilicon region on the sides of said middle area, a PN junction being defined on one side of said middle area and an NP junction being defined at the other side of said middle area, the concentration of impurities in said middle area being greater than $10^{18}$ per cubic centimeter, said polysilicon structure having been thermally annealed.

2. The method according to claim 1 wherein said side areas contain concentration of impurities of between $10^{18}$ and $10^{21}$, and wherein said concentration of said middle area is lower than the concentration of impurities in said side areas.

3. The method according to claim 1 wherein said middle area is doped with boron and said side areas are doped with an N type impurity.

4. The method according to claim 1 wherein said middle area includes both an N type impurity and a P type impurity.

5. The method according to claim 4 wherein the concentration of said P type impurity in said middle area is equal to or greater than said concentration of said N type impurity in said middle area.

6. The method according to claim 1 wherein said middle area is doped with a P type impurity to a concentration greater than $10^{18}$ per cubic centimeter, said side regions are doped with an N type impurity to a concentration of between $10^{18}$ and $10^{20}$ per cubic centimeter, said middle area contacting said two side areas and defining an electrical path therethrough, the contact of said middle area to said two side areas forming a pair of junctions, and said annealing comprises rapid thermal annealing.

7. The method of claim 1 wherein said semiconductor circuit comprises a static RAM of the type having memory cells each including a flip-flop with load resistances, said polysilicon structure operating as a said load resistance, said method including operation said static RAM by storing data in a memory cell thereof, said step of applying a voltage comprising passing current through said polysilicon structure from a source of operating voltage to a node within said flip-flop.

8. The method according to claim 7 wherein said resistance is between about 0.1 and about 50 gigaohms when said voltage is five volts over a temperature range of about minus 55 degrees centigrade to plus 125 degrees centigrade.

9. A method of using polysilicon structures as a load resistance in a semiconductor static RAM of the type including plural memory cells each having a pair of cross-coupled transistors, each of said transistors having gate electrodes, comprising:

coupling a pair of polysilicon structures between said gate electrodes and a source of operating voltage, and storing data in said memory cells by causing said cross-coupled transistors to assume a state corresponding to said data, thereby obtaining current through said polysilicon structures proportional to the voltages across them, said polysilicon structures operating as load resistors, each of said polysilicon structures comprising a polysilicon region, a selected one of N-type and P-type impurities defining other areas located in said polysilicon region on the sides of said middle area, a PN junction being defined on one side of said middle area and an NP junction being defined at the other side of said middle area, the concentration of impurities in said middle area being greater than $10^{18}$ per cubic centimeter, said polysilicon structures having been thermally annealed to reduce the resistivity thereof.

10. The method according to claim 9 wherein said side areas contain concentrations of impurities of between $10^{18}$ and $10^{21}$, and wherein said concentration of said middle area is lower than the concentration of impurities in said side areas.

11. The method according to claim 10 wherein said middle area is doped with boron and said side areas are doped with an N type impurity.

12. The method according to claim 10 wherein said middle area includes both an N type impurity and a P type impurity.

13. The method according to claim 12 wherein the concentration of said P type impurity in said middle area is equal to or greater than said concentration of said N type impurity in said middle area.

14. The method according to claim 9 wherein said middle area is doped with a P type impurity to a concentration greater than $10^{18}$ and $10^{20}$ per cubic centimeter, said middle area contacting said two side areas and defining an electrical path therethrough, the contact of said middle area to said two side areas forming a pair of junctions.

15. The method according to claim 10 wherein said resistance is between about 0.1 and about 50 gigaohms when said voltage is five volts over a temperature range of about minus 55 degrees centigrade to plus 125 degrees centigrade, and said polysilicon structures have been rapidly thermally annealed.

* * * * *